United States Patent
Honma (10) Patent No.: US 6,313,004 B1
(45) Date of Patent: Nov. 6, 2001

(54) METHOD FOR MANUFACTURING SEMICONDUCTOR DEVICES

(75) Inventor: Ichiro Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/438,949

(22) Filed: Nov. 12, 1999

(30) Foreign Application Priority Data

Nov. 11, 1998 (JP) .................................................. 10-321122

(51) Int. Cl.$^7$ .................................................. H01L 21/20
(52) U.S. Cl. .................................................. 438/398; 438/565
(58) Field of Search .................................................. 438/565, 398, 438/396, 253, 255

(56) References Cited

U.S. PATENT DOCUMENTS 5,798,280 * 8/1998 Mathews et al. ..................... 438/398
6,218,260 * 4/2001 Lee et al. ............................. 438/398

FOREIGN PATENT DOCUMENTS

| 2313477-A | * 11/1997 | (GB) | ..................... 438/398 |
| 354822 | 3/1991 | (JP) | . |
| 5218339 | 8/1993 | (JP) | . |
| 9-289292 | 11/1997 | (JP) | . |
| 9298278 | 11/1997 | (JP) | . |
| 10233493 | 9/1998 | (JP) | . |

* cited by examiner

*Primary Examiner*—Olik Chaudhuri
*Assistant Examiner*—(Vikki) Hoa B. Trinh
(74) *Attorney, Agent, or Firm*—Young & Thompson (57) ABSTRACT

After HSG-Si 15a is formed on the surface of a polycrystal silicon film 15, heat treatment is conducted on it using a phosphorus diffusion apparatus in an atmosphere of a mixture gas containing $POCl_3$, $O_2$, and $N_2$ gases in such a situation that the $O_2/POCl_3$ mole ratio is adjusted into 0.2 through 1.5, thus diffusing phosphorus into the HSG-Si 15a. With this, it is possible to suppress the corrosion of silicon by the chlorine radicals and inhibit the accelerated oxidation of silicon, thus preventing the reduction of the HSG-Si 15a.

23 Claims, 8 Drawing Sheets

Inter-layer insulator film
12
14 (13) 11
Explanation of reference numerals

(b)

15 Polycrystal silicon
12
11
14 (13)

(c)

HSG-Si (silicon grain)
15a
15
12
11
14 (13)

(d)

18 Upper electrode
17 Capacitive capacitance
15a
15
12
11
14 (13)

METHOD FOR MANUFACTURING SEMICONDUCTOR DEVICES

BACKGROUND OF THE INVENTION

1. Field of the Invention

The present invention relates to a method for manufacturing semiconductor devices and more particularly to such a method for manufacturing semiconductor devices that includes a step of doping impurities at a high concentration to hemi-spherical grained silicon (hereinafter abbreviated as HSG-Si: Hemi-Spherical Grained Si).

2. Description of the Related Art

There has been a demand recently for even higher integration densities of dynamic random access memories (DRAM's) and other semiconductor devices by increasing the electrostatic capacitance of a unit area of the component capacitor of each memory cell. To meet the demand, such a method has been adopted that increases the electrostatic capacitance by forming in a cylindrical shape either one of the upper and lower electrodes making up each capacitor, for example the lower electrode. According to another method, on the capacitor's surface of the electrode often made of polycrystal silicon are formed HSG-Si to provide irregularities in that surface in order to increase the surface area of the electrode, thus trying to increase the electrostatic capacitance. In this case, however, when HSG-Si is depleted, its electric resistance is increased, thereby preventing the capacitor's capacitance from being sufficiently increased. Usually, therefore, a diffusion method or an ion implantation method is used to dope impurities such as phosphorus into HSG-Si to reduce its electrical resistance.

A technology by means of a diffusion method for doping impurities into HSG-Si grains is disclosed in Japanese Laid-Open Patent Application No. Hei 9-289292. A method, described in this publication, for manufacturing semiconductor devices sequentially comprises steps of: forming inter-layer insulator films on a semiconductor substrate; forming cell contacts; forming polycrystal silicon films having irregularities in the surface; forming an oxidized film of silicon (hereinafter called PSG: Phospho Silicated Glass) on the above-mentioned polycrystal silicon film; diffusing impurities from this PSG film into the irregularly-surfaced polycrystal silicon film; and removing the PSG films. According to this manufacturing method, PSG films must undergo heat treatment at a temperature of about 800–950° C. for about 10–60 minutes.

SUMMARY OF THE INVENTION

Figure 8:
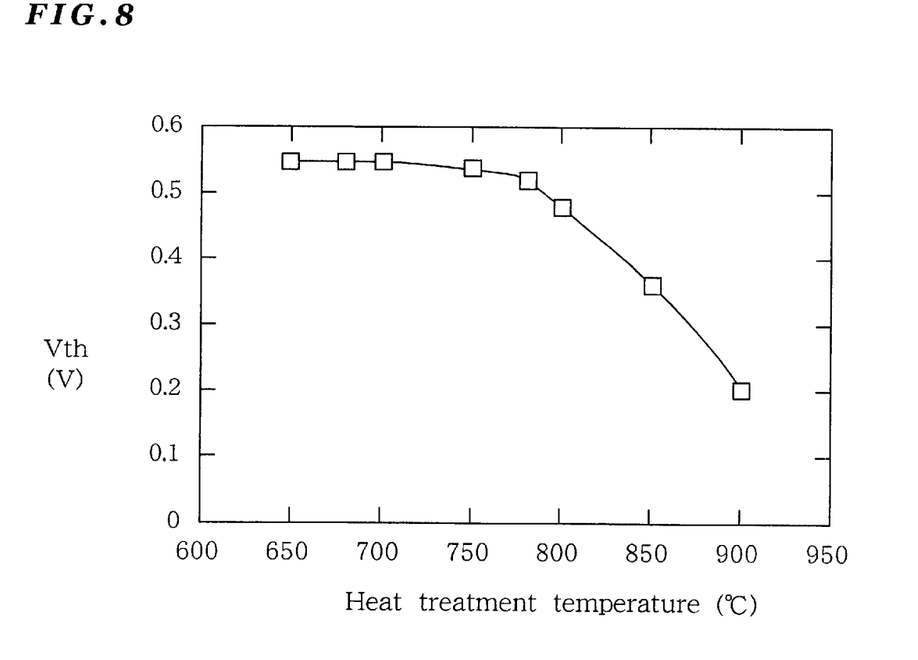
FIG. 8 is a graph showing a relationship between a heat treatment temperature and a threshold voltage of transistors.

Unlike the case of standalone DRAM devices, where there are not so severe restrictions on the temperature of heat treatment during the manufacturing processes, in the case of logic-mixed memory devices in which DRAM's and logic LSI's are mounted on the same chip, there are needs to set the heat treatment temperature at a low value or the heat treatment time at a short value in order to protect the transistors of a logic portion which have a short gate length liable to suffer from fluctuations in the threshold voltage and the characteristics. As shown in FIG. 8, for example, when heat treatment is conducted on transistors with a gate length of 0.25 $\mu$m, the transistors' threshold voltage (Vth) has roughly a constant value up to a heat treatment temperature of about 780° C., whereas in excess of 780° C. the threshold voltage would drop rapidly. The conventional manufacturing methods described in the above-mentioned publication, however, carry out the heat treatment at a high temperature of about 800–950° C. for several tens of minutes in the doping of phosphorus, to cause changes in the threshold voltage of the logic-portion transistors, thus disqualifying themselves for use in the manufacturing of the above-mentioned logic-mixed memory devices.

With the method described in the above-mentioned publication, on the other hand, whereby phosphorus is diffused under the usually employed conventional conditions without forming PSG films on the HSG-Si surface, PSG-Si films are for sure formed on the HSG-Si surface but, at the same time, a lot of silicon atoms are dissipated from the HSG-Si side when the PSG films are grown, so that as the PSG films grow, a larger amount of the HSG-Si is lost, finally resulting in a small amount of the HSG-Si being left when the surface PSG films are removed. By this reason, even if HSG-Si grains are formed, the irregularities in the electrode surface are reduced small, thus causing a problem that the capacitance cannot sufficiently be increased even with increases in the area of the electrode surface.

Figure 9:
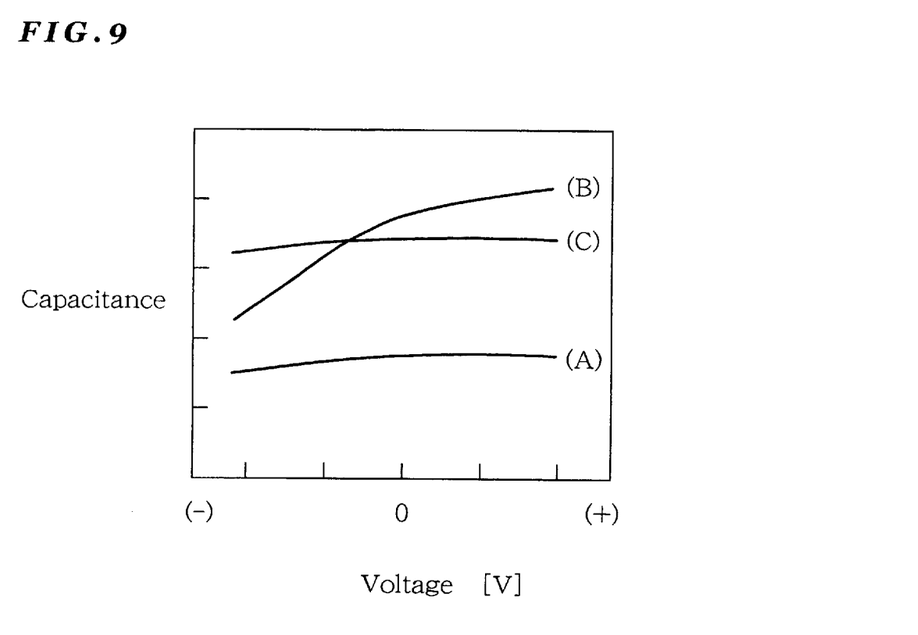
FIG. 9 is a graph showing a relationship between application voltage and capacitance for various capacitors.

FIG. 9 summarizes the (C–V) characteristics of capacitors formed by the above-mentioned conventional methods.

In the figure, a curve (A) indicates the characteristics of a capacitor having flat surfaces with no HSG-Si formed on its electrode surfaces. This curve shows a lower value of overall capacitance. A curve (B), on the other hand, indicates the characteristics of another capacitor on which is formed HSG-Si containing no impurities on the electrode surfaces. As indicated by this curve, thus formed HSG-Si increased overall capacitance as compared to the case of (A) but no impurities introduced in the HSG-Si caused depletion in the HSG-Si grains, thus resulting in large decreases in the capacitance when a negative voltage is applied to the electrode.

As against this, a curve (C) indicates the characteristics of still another capacitor with phosphorus introduced in HSG-Si. One example of diffusion phosphorus is: temperature: 750° C., an atmosphere of a gas of $N_2$, $POCl_3$, and $O_2$ in a mixture, flow rate being 20 slm for $N_2$, 300 mg/m for $POCl_3$, 400 sccm for $O_2$, diffusion time being 30 minutes. In this case, the mole ratio of $O_2/POCl_3$ was about 8. In the case of the curve (C), some phosphorus introduced in HSG-Si suppressed the depletion on the negative voltage side to bring about flattened characteristics, with a low absolute value of the capacitance on the positive voltage side as compared to the curve (B) though. The possible reason is that although phosphorus introduced suppressed depletion, the surface area of the capacitor was decreased by such a plurality of synergetic effects that the HSG-Si grains are reduced due to the etching of silicon caused by Cl radicals generated from $POCl_3$ in a gas being processed at the time of the diffusion of phosphorus, and that a larger partial pressure of $O_2$ and the accelerated oxidation of halogens increased the oxidation amount (loss amount) of the grains, and other factors. The rate of capacitance decreases was 15%–40% approximately.

Thus, it was difficult by the conventional methods to establish at the same time such two conditions of doping impurities into HSG-Si to suppress the depletion of HSG-Si and of inhibiting the reduction of the HSG-Si.

In view of the above-mentioned problems, an object of the present invention is to provide a method for manufacturing semiconductor devices that even with heat treatment of a relatively low temperature, it is possible to dope impurities to HSG-Si and also to subsequently inhibit the reduction of the HSG-Si grains.

To achieve the above-mentioned object, the present inventor has already applies such a "method for manufacturing semiconductor devices" that HSG-Si is formed on the surface of the lower electrode of a capacitor and then a thin CVD-oxidized film is formed on the HSG-Si surface, through which CVD-oxidized film is diffused phosphorus into the HSG-Si in a solid phase. According to this method, since phosphorus is constantly supplied into the CVD-oxidized film from an atmospheric gas containing phosphorus, the phosphorus concentration is not decreased with elapse of time, thus making it possible to dope phosphorus into the HSGO-Si in a stable manner. At the same time, the CVD-oxidized film functions as a buffer layer against the oxidation involved in the diffusion of phosphorus to suppress the dissipation of the silicon atoms from the HSG-Si grains, thus preventing the reduction of the HSG-Si.

Although this method achieves the above-mentioned object, it requires a step of forming on the HSG-Si surface a CVD-oxidized from which acts as a buffer layer, which may be called a film to prevent the losing of HSG-Si, against oxidation, thus suffering from a problem of increasing the number of steps required. Also, thus formed CVD-oxidized film functions as an intervention film for the solid-phase of phosphorus and therefore is unnecessary after this functioning as the above-mentioned buffer layer, so that another step required to remove the CVD-oxidized film after phosphorus is diffused, thus further increasing the number of steps required. To guard against this, the present invention provides a new method for manufacturing semiconductor devices which achieves the above-mentioned object by overcoming the disadvantages of the above-mentioned applied method without increasing the number of steps in particular.

A first method for manufacturing semiconductor devices according to the present invention comprises the steps of: forming silicon films; conducting heat treatment on the above-mentioned silicon films in an atmospheric gas containing silicon as a constituent element to form silicon grains to the surfaces of these silicon films; and conducting heat treatment at a prescribed temperature to diffuse phosphorus into the above-mentioned silicon grains in such a situation that in an atmosphere of a mixture gas containing an oxygen gas and another gas containing halogen and phosphorus as the constituent elements in a phosphorus-diffusing apparatus, the mixture ratio in moll of the above-mentioned oxygen gas against the above-mentioned gas containing halogen and phosphorus is adjusted into such a range that the corrosion of silicon due to the above-mentioned halogen may be suppressed and also that the above-mentioned halogen may not accelerate the oxidation of silicon.

Generally, when phosphorus is diffused in a mixture gas system of an oxygen gas and another gas containing halogen and phosphorus as constituent elements, in a range where the mixture ratio in mole of the gas containing halogen and phosphorus is large, the effect of silicon by the halogen radicals generated from that gas is significant. In a range where the mixture ratio in mole of the oxygen gas is in excess of a certain rage, a larger partial pressure of the oxygen gas increases the amount of oxidation and also the halogen accelerates the oxidation to increase the oxidation amount, thus rapidly amplifying the oxidation of silicon.

According to the first method for manufacturing semiconductor devices of the present invention, however, since the mixture ratio in mole of the oxygen gas against the gas containing halogen and phosphorus in a phosphorus diffusing apparatus is adjusted into the above-mentioned range that the corrosion of silicon is suppressed with oxidation not being accelerated, the silicon grains are not reduced and the silicon atoms in the silicon grains are not lost by the oxidized film, thus making it resultantly possible to suppress the reduction of the silicon grains.

In the above-mentioned first method for manufacturing semiconductor devices, it is possible to use a phosphoryl chloride gas ($POCl_3$) as the gas containing halogen and phosphorus as the constituent elements. Also, preferably, the mixture ratio in mole of the oxygen gas against the phosphoryl chloride gas is 2 or less in mole ratio. More preferably, this mixture mole ratio is 0.2 through 1.5.

That is, if the above-mentioned system of an oxygen gas and another gas containing halogen and phosphorus as the constituent elements is specifically a mixture gas of $POCl_3$ and $O_2$, when the mole ratio of the $O_2/POCl_3$ is less than 0.2, the corrosion of silicon by the chlorine radicals is significant and, when the mole ratio of $O_2/POCl_3$ exceeds 1.5, the effect of accelerating the oxidation of silicon by the chlorine radicals begins to appear, and when it is 2 or higher, becomes remarkable. Therefore, preferably, the mole ratio of $O_2/POCl_3$ is 2 or less, more preferably, 0.2 through 1.5.

A second method for manufacturing semiconductor devices according to the present invention comprises the steps of: forming silicon films; conducting heat treatment on the above-mentioned silicon films in an atmosphere of a gas containing silicon as the constituent element to form silicon gains to the surfaces of these silicon films; and adjusting the timing of introducing a plurality of gases used in a phosphorus diffusing apparatus into a gas processing chamber to prevent the corrosion of silicon by halogen and also by earlier introducing a gas for forming films having a function to permit the permeation of phosphorus, to form corrosion-preventing films in the above-mentioned surfaces of the silicon grains and then introduce a gas containing halogen and phosphorus and conduct heat treatment at a prescribed temperature, thus diffusing phosphorus into the above-mentioned silicon grains through the above-mentioned corrosion-preventing films.

As mentioned above, according to the earlier applied invention by the present inventor, CVD-oxidized films are formed on the surface of silicon grains and, through these CVD-oxidized films, phosphorus is diffused in a solid phase into the silicon grains, which requires a step of forming these CVD-oxidized films before the step of diffusing phosphorus. As against this, the second method for manufacturing semiconductor devices according to the present invention, although the same as that in diffusing phosphorus in a solid phase through films formed on the surface of silicon grains, only needs to adjust the timing of introducing a plurality of gases used in a phosphorus diffusing apparatus into a gas processing chamber to form films which phosphorus can permeate before it is diffused, thus not requiring the step of forming films unlike that earlier applied invention.

The gases used to form the above-mentioned corrosion-preventing films in the above-mentioned method include an oxygen gas. Also, preferably, its film thickness is 2–5 nm. The above-mentioned gases containing halogen and phosphorus include phosphoryl chloride gas. Specifically, therefore, by providing a mixture gas an oxygen gas and a phosphoryl chloride gas as the gas used in a phosphorus diffusing apparatus and introducing the oxygen gas of these gases a little earlier, for example by a few minutes, than the other into the processing chamber and then introducing the phosphoryl chloride gas, thin oxidized silicon films can be formed on the surface of silicon grains and then, through thus formed oxidized films, phosphorus is diffused into the silicon grains. Therefore, the existence of the oxidized silicon films suppresses the dissipation of silicon present in the silicon grains when phosphorus is diffused, thus preventing the reduction of the silicon grains.

A third method for manufacturing semiconductor devices according to the present invention comprises the steps of: forming silicon films; conducting heat treatment on the above-mentioned silicon films in an atmosphere of a gas containing silicon as the constituent element to form silicon grains to the surfaces of these silicon films; and introducing that gas containing silicon as the constituent element at the same timing as or earlier than a gas containing halogen and phosphorus as the constituent elements used in a phosphorus diffusing apparatus into the gas processing chamber and conducting heat treatment at a prescribed temperature, to prevent the reduction of silicon grains due to the corrosion of silicon by halogen, by virtue of a supply of silicon from that gas containing silicon as the constituent element, while diffusing phosphorus into the above-mentioned silicon grains.

Unlike the earlier mentioned two methods by which the loss of silicon atoms into the oxidized film can be suppressed to inhibit the reduction of silicon grains itself, the third method diffuses phosphorus while compensating for the loss of silicon grains by virtue of a supply of silicon atoms to the silicon grains. That is, by the third method, a gas containing silicon is introduced at the same time as or earlier than a gas containing halogen and phosphorus used in a phosphorus diffusing apparatus, to supply silicon atoms from the gas containing silicon to the silicon grains, so that as the silicon grains grow, the silicon grains tend to be reduced by the corroding action of the gas containing halogen and phosphorus. Those actions are offset, thus, as a result, diffusing phosphorus into the silicon grains without reducing the silicon grains so much.

In the above-mentioned third method, a phosphoryl chloride gas can be used as the above-mentioned gas containing halogen and phosphorus. Also, it is possible to use a gas containing mono-silane or di-silane as the above-mentioned gas containing silicon.

All over the above-mentioned first through third methods of the present invention, preferably the temperature for heat treatment in the above-mentioned phosphorus diffusion step is 700–780° C. According to the methods of the present invention, at these heat treatment temperature, phosphorus can sufficiently be diffused and also those transistors with a short gate length can be formed without fluctuations in the threshold voltage.

Also, between the step of forming silicon films and the step of forming silicon grains can be formed a step of patterning the silicon films into a prescribed shape, to form silicon grains to the silicon films after being patterned, so that these steps and a phosphorus diffusing step can be combined to form the lower electrode of the capacitors. With this, it is possible to manufacture logic-mixed memory devices having the above-mentioned capacitor. That is, the methods for manufacturing semiconductor devices by the present invention qualify themselves well for the manufacturing of the logic-mixed memory devices in which are mixed the logic portion which has a short gate length of transistors and are liable to be delicately influenced, in terms of electrical characteristics, by the manufacturing conditions as a processing temperature and a DRAM which has capacitors desired to be increased in capacitance.

DESCRIPTION OF THE PREFERRED EMBODIMENTS

[First embodiment]

Figure 1:
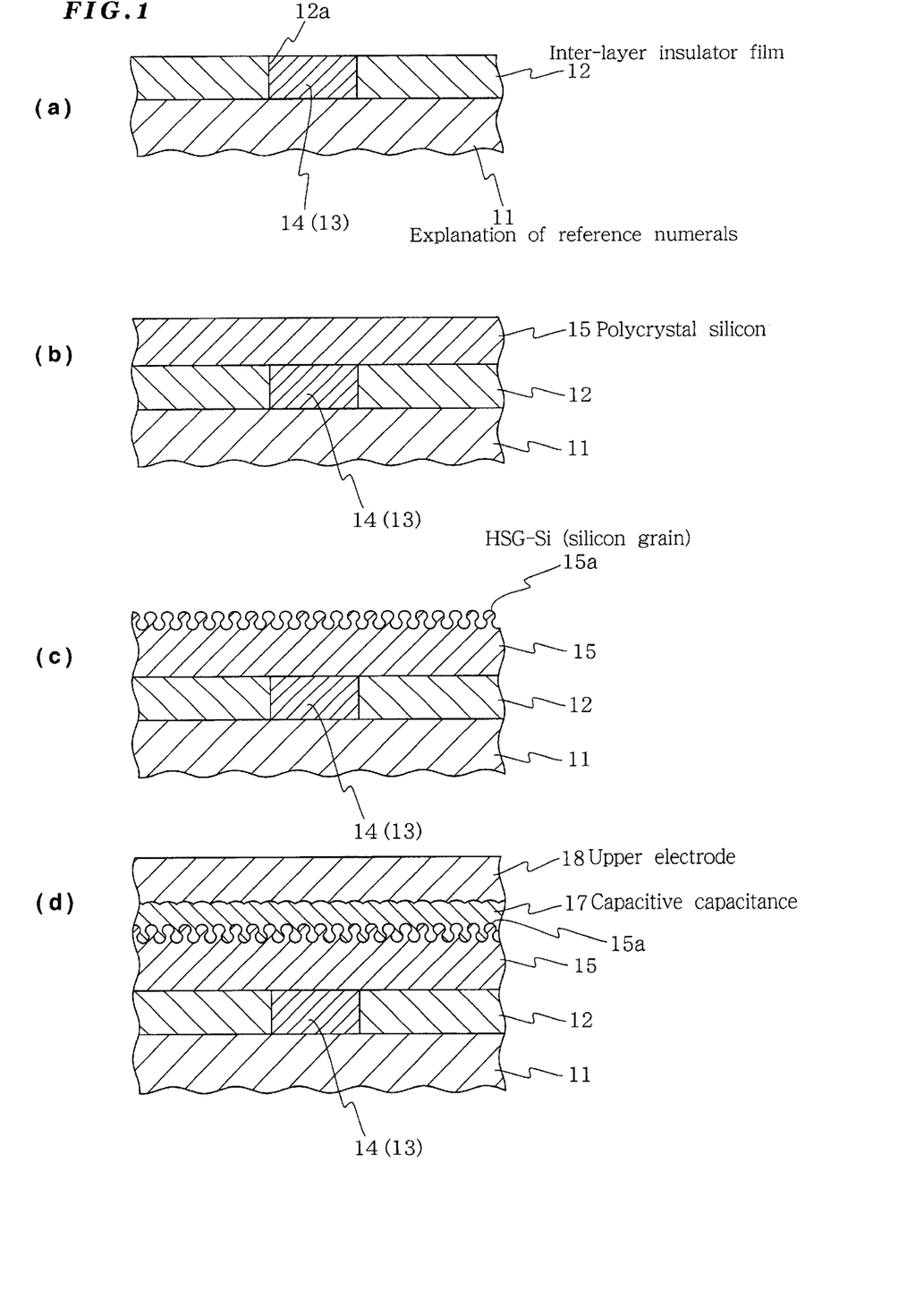
FIGS. 1a–d are schematic diagrams sequentially showing steps of a method for manufacturing semiconductor devices according to a first embodiment of the present invention.
Figure 2:
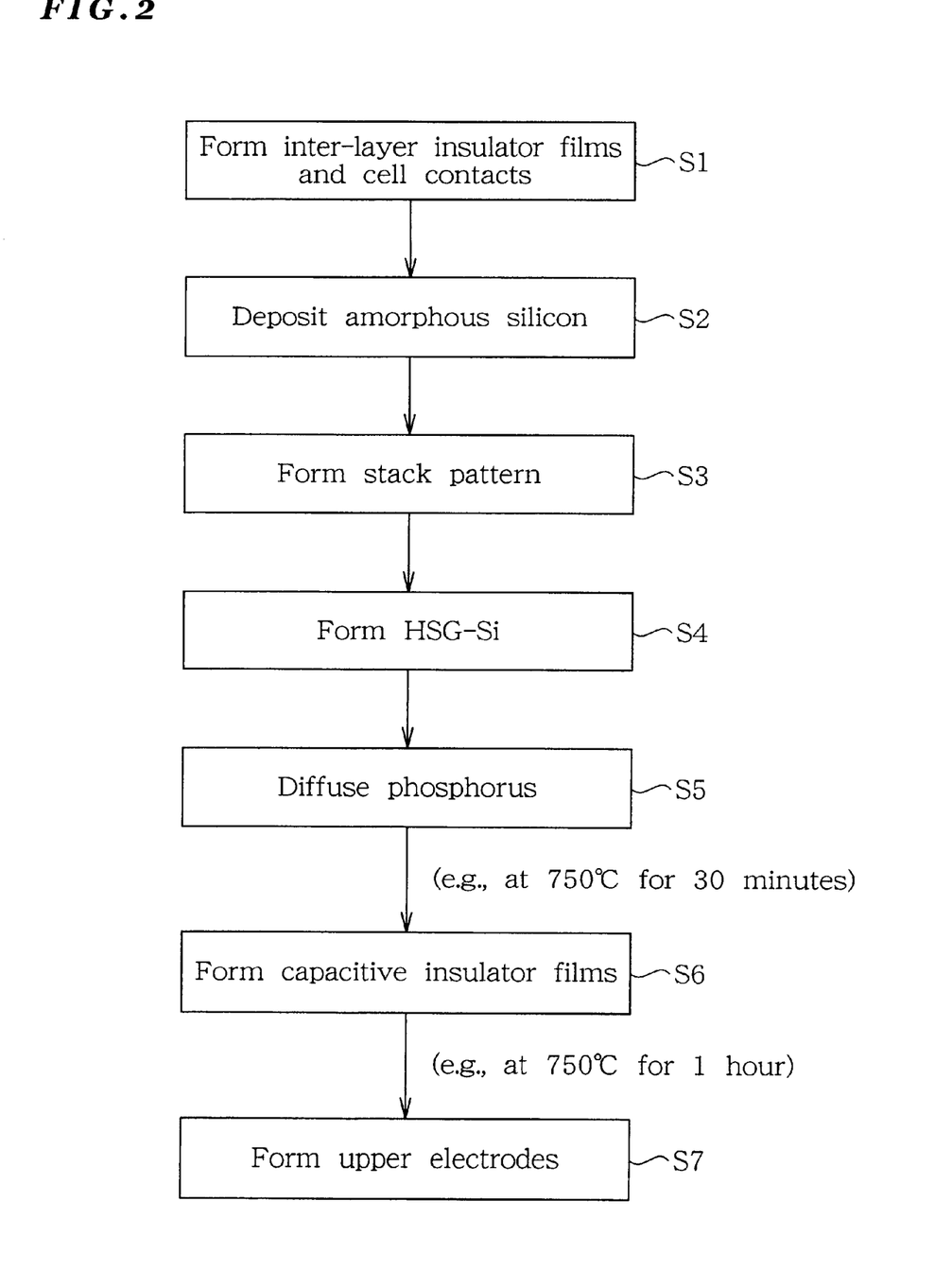
FIG. 2 is a flowchart of the manufacturing method according to the present invention.

The following will describe the first embodiment of the present invention with reference to FIGS. 1–5. FIGS. 1(a–d) are schematic cross-sectional views illustrating a method for manufacturing semiconductor devices according to the present embodiment, while FIG. 2 is a flowchart for sequential steps of the present method.

Note here that in this specification, a silicon grain is abbreviated as "HSG-Si." HSG originally implies being "Hemi-Spherical" but actual silicon grains include any shape of grains including hemi-spherical ones. In the figures, however, they are illustrated in spheres for convenience.

Now one embodiment of the manufacturing method is described with reference to FIGS. 1 and 2.

Although the overall method for manufacturing semiconductor devices includes the steps of forming transistors, forming wiring layers, etc., the following will describe only a step of forming capacitors which features the present invention.

First, as shown in FIG. 1A, an inter-layer insulator made of $SiO_2$ film 12 is formed on a semiconductor substrate 11 using the CVD method and then a contact hole 12a is formed in the inter-layer insulator film 12 using the photolithographic technology to expose a prescribed area of the semiconductor substrate 11. Subsequently, a polycrystal silicon film 14 to which phosphorus has been doped is formed all over the substrate and embedded into the contact hole 12a and then etched back to leave the polycrystal silicon film 14 only in the contact hole 12a as a cell contact 13 (step S1 in FIG. 2). Note here that in place of the above-mentioned polycrystal silicon film 14, an amorphous silicon film may be used.

Next, heat treatment is conducted on the semiconductor substrate 11 according to the CVD method at a prescribed temperature in an atmosphere of a mono-silane ($SiH_4$) gas or a di-silane ($Si_2H_6$) gas and a phosphine ($PH_3$) gas. With this, as shown in FIG. 1B, on the inter-layer insulator film 12 as well as on the cell contact 13 is deposited a polycrystal silicon film 15 to a film thickness of for example 500 nm which serves as the lower electrode of static capacitors of each memory cell (step S2 in FIG. 2). As the polycrystal silicon film 15, a film to which phosphorus is either doped or not may be used.

Next, the above-mentioned polycrystal silicon film 15 is patterned by the photolithographic technology into a desired shape of the lower electrode, for example a cylindrical shape (step S3 in FIG. 2). Then, contaminated layers and natural oxide films are removed from the surface of the polycrystal silicon film 15, to subsequently conduct heat treatment on that film 15 at a temperature of 540–630° C. in an atmosphere containing a mono-silane gas or a di-silane gas. Then, heat treatment is conducted on the polycrystal silicon film at almost the same temperature of 540–630° C. in a vacuum atmosphere. With this, as shown in FIG. 1C, HSG-Si 15a (silicon grains) are formed on the polycrystal silicon film which acts as the lower electrode (step S4 in FIG. 2). The heat treatment for thus forming HSG grains can be conducted not only in a vacuum atmosphere but also in an atmosphere of such an inert gas as argon (Ar), i.e. such an atmosphere that will not prevent the formation of HSG-Si 15a on the polycrystal film 15.

Figure 3:
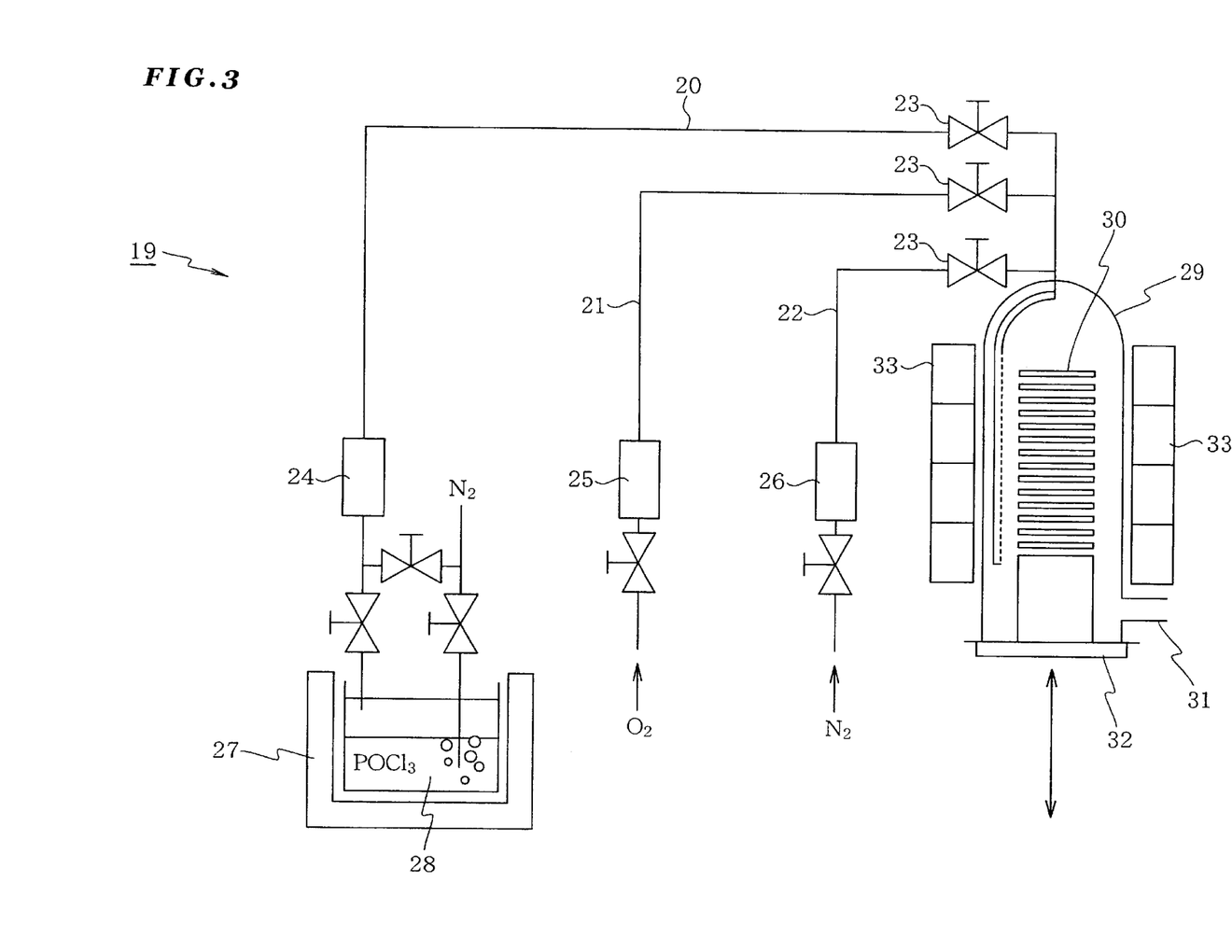
FIG. 3 outlines a configuration of a phosphorus diffusion apparatus used in the manufacturing method of the present invention.

Next, a phosphorus diffusing apparatus is used to conduct phosphorus processing on the polycrystal silicon in a mixture gas atmosphere containing a phosphoryl chloride ($POCl_3$) gas, an oxygen ($O_2$) gas, and a nitrogen ($N_2$) gas (step S5 in FIG. 2). FIG. 3 outlines the configuration of a phosphorus diffusing apparatus 19, which is a batch-type vertical diffusion furnace capable of batch processing of a plurality of wafers of substrates. As a supply source of a processing gas are provided three systems of supply pipes 20, 21, and 22 for a $POCl_3$ gas, an $O_2$ gas, and a $N_2$ gas, each of which has on its halfway a valve 23 and mass-flow controllers 24, 25, and 26 to control the flow rate of the corresponding gas. By spraying a $N_2$ gas into liquefied $POCl_3$ 28 contained in a Dewar flask 27, the $POCl_3$ 28 is vaporized and then introduced into a furnace body 29 via a pipe 20 in the configuration. The mixture gas introduced into the furnace body 29 at its top is diffused from the side of a plurality of substrates 30 into overall the furnace body 29 and exhausted from an exhaust port 31 at the furnace bottom. Also, a boat 32 for holding the plurality of substrates 30 is so configured as to be lifted and lowered with respect to the furnace body 29, around which a heater 33 is provided. Using this phosphorus diffusing apparatus 19, it is possible to conduct heat treatment on the substrates 30 in a mixture-gas atmosphere containing a $POCl_3$ gas and an $O_2$ gas and a $N_2$ gas, to diffuse phosphorus.

A control unit (not shown) is used to control the mass-flow controllers 24, 25, and 26, to set a mixture ratio in moll of the $O_2$ gas against the $POCl_3$ gas at the time of phosphorus diffusion at 0.2 through 1.5 in mole ratio. In this case, the flow rate of $N_2$ gas is arbitrary. Also, phosphorus is to be diffused at a temperature of for example 750° C. for 30 minutes. With this, extremely thin oxide films can be grown, while at the same time, through thus formed oxide films, phosphorus can be diffused into HSG-Si in a solid phase. In this case, the heat treatment is preferably conducted at about 700–780° C. for about 10–120 minutes.

Subsequently, as shown in FIG. 1D, heat treatment is conducted by the CVD method at a temperature of for example about 750° C. for about one hour in a prescribed gas atmosphere, to form a capacitive insulator film 17 made of for example silicon nitride ($Si_3N_4$) on the polycrystal silicon film 15 on whose surface are formed the HSG-Si 15a (step S6 in FIG. 2). Then, a polycrystal silicon film onto which phosphorus is doped is deposited on the capacitive insulator film 17 by the CVD method etc. and then patterned into an upper electrode 18 (step S7 in FIG. 2). Then, the polycrystal silicon acting as the upper electrode 18 is permitted to undergo heat treatment in a nitrogen ($N_2$) gas atmosphere, to be activated. With the above-mentioned steps, the forming of capacitors is terminated.

Figure 4:
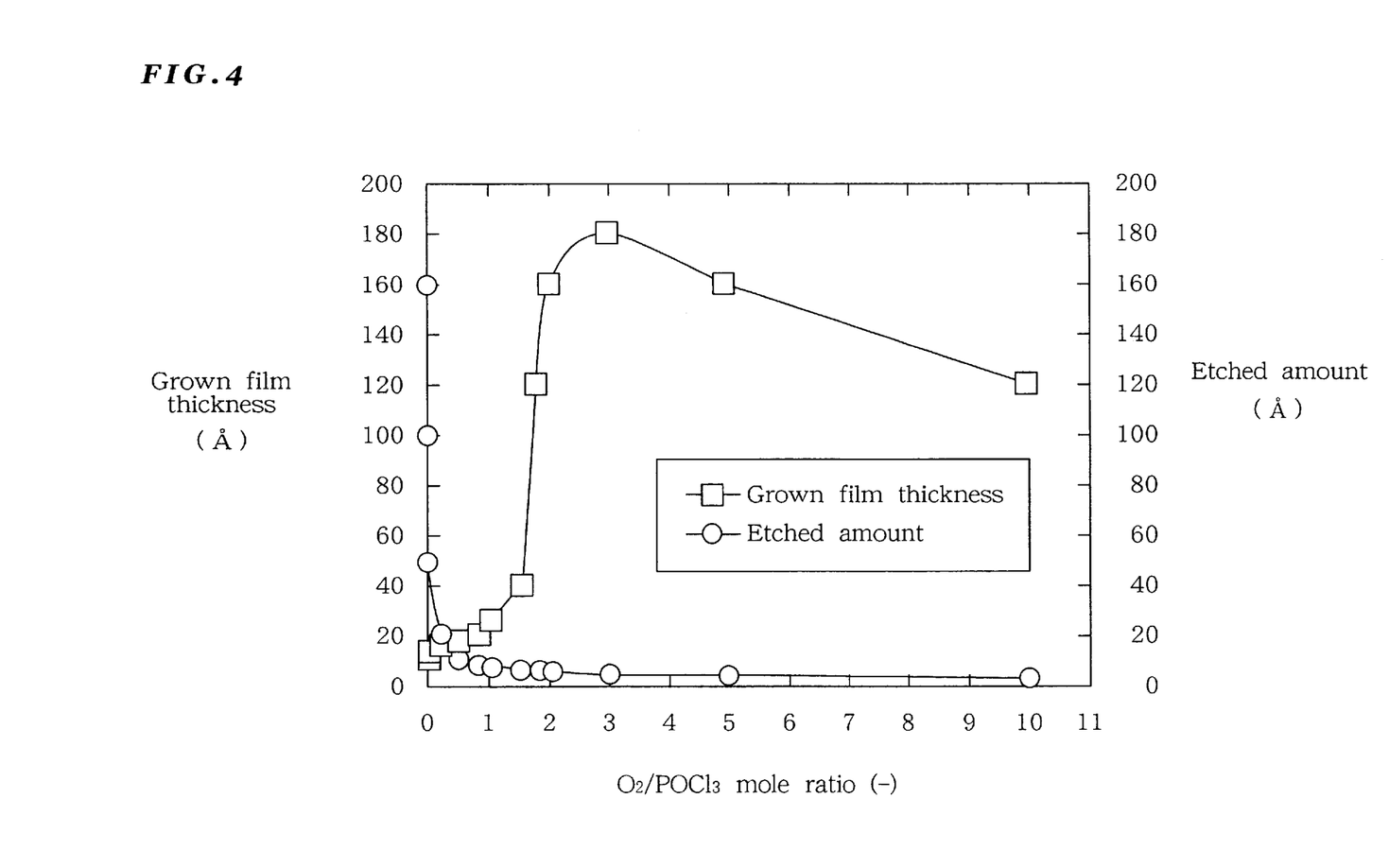
FIG. 4 is a graph showing relationships of the etched amount of silicon and the thickness of oxide films grown on silicon versus changes in a mole ratio of $O_2/POCl_3$ in diffusion of phosphorus.

According to the method for manufacturing semiconductor devices by the present invention, by adjusting the mole ratio of $O_2/POCl_3$ in a step of diffusing phosphorus, phosphorus can surely be introduced into HSG-Si 15a as suppressing the reduction of the HSG-Si 15a, thus increasing the capacitance of the capacitors. FIG. 4 is a graph which shows relationships of the silicon's etched amount and the thickness of an oxide film (PSG film) grown on silicon as against changes in the $O_2/POCl_3$ mole ratio. In FIG. 4, the right-side vertical axis represents an etched amount (unit: Å), which is indicated by ○, and the left-side vertical axis represents a thickness of the film grown (unit: Å), which is indicated by □, and the horizontal axis represents a mole ratio of $O_2/POCl_3$. The conditions for experiments of obtaining the data shown in FIG. 4 were: temperature of 750° C., $N_2$ flow rate of 20 SLM, $POCl_3$ flow rate of 300 mg/m, and time of 30 minutes. The flow rate of $O_2$ in these experiments was controlled so that its mole ratio against $POCl_3$ may be an X axis.

As can be seen from FIG. 4, the etched amount would increase extremely due to the corrosive action of silicon by Cl radicals in a $O_2/POCl_3$ mole-ratio range of 0 through 0.2 and, in excess of 0.2, would gradually decrease. The grown film thickness, on the other hand, was found to stay small in the $O_2/POCl_3$ mole-ratio of 0 through 1.5 and, in excess of 1.5, rapidly increase because of increases in the oxidation amount caused by a larger partial pressure of $O_2$ and because of the oxidation-amount increasing action beginning to be given by the accelerated oxidation of Cl.

Figure 5:
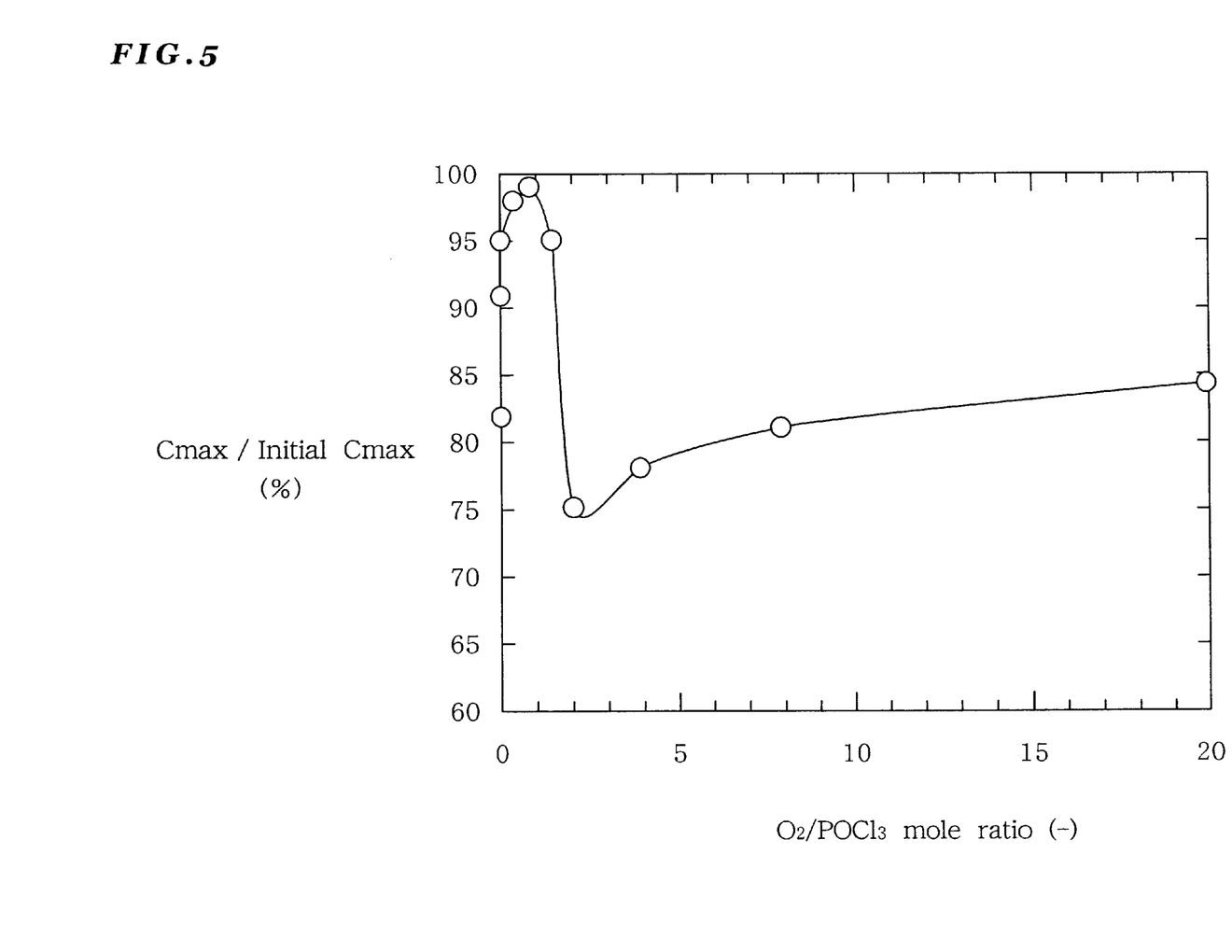
FIG. 5 is a graph showing the results of measuring the capacitance of capacitors made with various values of the mole ratio of $O_2/POCl_3$ according to the method of the present invention.

The inventor of the present invention measured the capacitance of capacitors made in various values of the $O_2/POCl_3$ mole ratio according to the above-mentioned embodiment. The results are shown in FIG. 5, in which the vertical axis represents the standardized value of the maximum capacitance (Cmax) of a capacitor when phosphorus was diffused divided by the initial Cmax when phosphorus was not diffused where the range was changed from 0 through 20 for the mole ratio of $O_2/POCl_3$ against HSG-SI 15A, and the horizontal axis represents the $O_2/POCl_3$ mole ratio. The conditions for experiments of obtaining the data shown in FIG. 5 were: temperature of 750° C., $N_2$ flow rate of 20 SLM, $POCl_3$ flow rate of 300 mg/m, and time of 30 minutes. The flow rate of $O_2$ was controlled so that its mole ratio against $POCl_3$ may be an X axis.

As can be seen from FIG. 5, the standardized Cmax value exhibits its maximum value of nearly 100% when the $O_2/POCl_3$ mole ratio is about 1 and, when the $O_2/POCl_3$ mole ratio is about 2, it exhibits its minimum value of about 75% and then increases a little with the increasing mole ratio of $O_2/POCl_3$. In a range of 0.2 through 1.5 of the $O_2/POCl_3$ mole ratio, the standardized Cmax value is 95% or higher, in other words, it was found that by diffusing phosphorus in an adjusted range of 0.2 through 1.5 of the $O_2/POCl_3$ mole ratio, the decrease rate of Cmax can be suppressed to 5% or less. This range of 0.2 through 1.5 of the mole ratio corresponds to the above-mentioned range in FIG. 4 in which the corrosion of silicon is suppressed without accelerated oxidation. Thus, according to the present method, only by controlling the $O_2/POCl_3$ mole ratio, the reduction of HSG-Si 15a can be inhibited, thus preventing both the decrease in the capacitance of capacitors on the side of negative-voltage application caused by the depletion of the HSG-Si 15a and the decrease of the overall level of the capacitors' capacitance.

Also, according to the method by the embodiments of the present invention, there is no need to form a step for preventing the reduction of HSG-Si 15a such as forming of CVD-oxidized films which act as a buffer film against oxidation at the time of phosphorus diffusion, thus avoiding increases in the number of steps required for the overall manufacturing processes as compared to the conventional methods. Also, the method according to the embodiment of the present invention uses a $POCl_3$ gas as the supply source of phosphorus, so that since a phosphorus diffusion furnace using a $POCl_3$ gas as the processing gas is quite usual apparatus, the present method can be said to be a very versatile method because it can accommodate the processing only by controlling the gas used in this apparatus.

Further, since the method of the present invention employs a temperature of 700–780° C. for heat treatment in the phosphorus diffusing step, even such transistors that have a short gate length are free of fluctuations in the threshold voltage. Therefore, the present method qualifies itself well for use in manufacturing logic-mixed memory devices in which are mixed the logic portion subject to fluctuations in the electrical characteristics because of a short gate length of their transistors and the DRAM portion having capacitors desired to have a larger capacitance.

[Second Embodiment]

Figure 6:
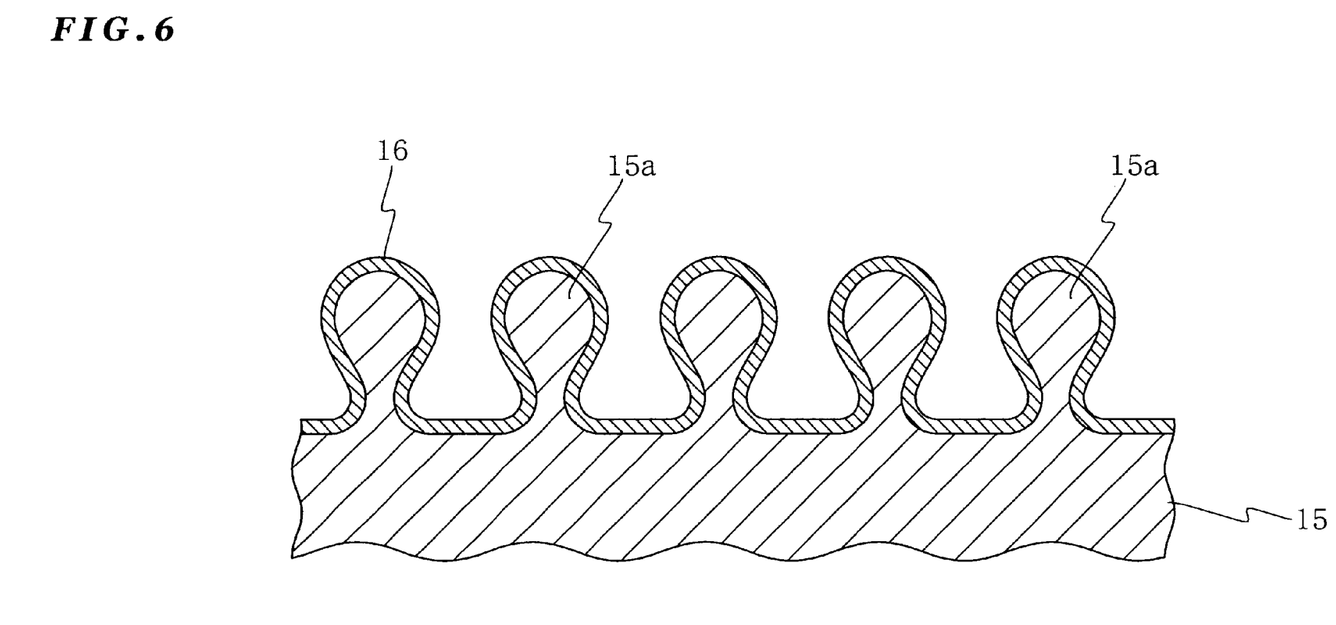
FIG. 6 is a cross-sectional view of HSG-Si made by the method for manufacturing semiconductor devices according to a second embodiment of the present invention.

The following will describe the second embodiment of the present invention with reference to FIG. 6. The method for manufacturing semiconductor devices according to the present embodiment has almost the same basic flow of steps as the first embodiment, thus sharing in common the cross-sectional view shown in FIG. 1 and the flowchart shown in FIG. 2. The second embodiment is different from the first embodiment only in a respect of the method for diffusing phosphorus (sequence for introducing a gas for the phosphorus diffusion apparatus), so that only this respect is described below.

In the present embodiment, as shown in FIG. 1C, when phosphorus is diffused using the phosphorus diffusion apparatus 19 after the HSG-Si 15a is formed on the polycrystal silicon film 15, the $POCl_3$ gas and the $O_2$ gas are not introduced into the furnace body 29 at the same time but, instead, with the timing being shifted, only the $O_2$ gas is introduced and, a few minutes for example five minutes later, the $POCl_3$ gas and the $N_2$ gas are introduced. This can be easily done by controlling the valve system for the phosphorus diffusion apparatus shown in FIG. 3. Note here that according to the present embodiment, when five minutes has passed, the mixture ratio in mole of the $POCl_3$ gas and the $O_2$ gas is arbitrary, with the temperature and the time for diffusing phosphorus being almost the same as those for the first embodiment.

Subsequently, like the case of the first embodiment, the second embodiment carries out the steps of diffusing phosphorus into the HSG-Si 15a using a mixture gas of $O_2$, $POCl_3$, and $N_2$ gases, forming the capacitive insulator film 17, and forming the upper electrode 18, thereby forming the capacitor such as shown in FIG. 1D.

According to the present embodiment, prior to the introduction of a $POCl_3$ gas by five minutes, an $O_2$ gas is introduced, thus forming thin silicon oxide films 16 with a thickness of 2–5 nm (corrosion-preventing films) on the HSG-Si 15a surface before phosphorus actually begins to be diffused, through which oxide film 16 is diffused phosphorus into the HSG-Si 15a. Therefore, the presence of this silicon oxide film 16 suppresses the dissipation of silicon atoms in the HSG-Si 15a during the diffusion of phosphorus, thus preventing the reduction of the HSG-Si 15a. The method according to the present embodiment will not use the CVD method etc. to form corrosion-preventing films but only adjusts the timing for introduction of gases into a furnace which are used in a phosphorus diffusion apparatus to form thin corrosion-preventing films, therefore, needs not to provide another step of forming films, thus avoiding increases in the number of steps required.

[Third Embodiment]

The following will describe the third embodiment of the present invention. The method for manufacturing semiconductor devices according to the present embodiment has almost the same basic flow of steps as the first embodiment and also shares in common the cross-sectional view shown in FIG. 1 and the flowchart shown in FIG. 2. The method for manufacturing semiconductor devices according to the third embodiment differs from the first and second embodiments only in a respect of the method for diffusing phosphorus (processing gas used in the phosphorus diffusion apparatus), so that only this respect is described below.

In the present embodiment, as shown in FIG. 1C, when phosphorus is diffused after the HSG-Si 15a is formed on the polycrystal silicon film 15 surface, at the same time as the introduction of $POCl_3$, $O_2$, and $N_2$ gases or prior to the introduction of the mixture gas of these gases, a mono-silane or di-silane gas is introduced to perform heat treatment at a prescribed temperature. In this case, a pipe must be formed for supplying a mon-silane or di-silane gas to the phosphorus diffusion apparatus shown in FIG. 3. According to the present embodiment, the mixture ratio in mole for the $POCl_3$ and $O_2$ gases and the $N_2$ gas flow rate are arbitrary, with the temperature and the time for phosphorus diffusion being almost the same as those for the first and second embodiments.

Subsequently, like the first embodiment, the present embodiment carries out the steps of diffusing phosphorus into the HSG-Si 15a using the abovementioned mixture gas, forming the capacitive insulator film 17, and forming the upper electrode 18, thus forming the capacitor such as shown in FIG. 1D.

As against the methods according to the first or second embodiment, which suppress the corrosion of the HSG-Si 15a or the loss of silicon atoms in the HSG-Si 15a toward the oxide film in order to inhibit the reduction itself of the HSG-Si 15a, the present embodiment supplies silicon atoms from a moni-silane or di-silane gas, thus diffusing phosphorus as compensating for the loss of the HSG-Si 15a. That is, by the present embodiment, as silicon atoms are supplied from a moni-silane or di-silane gas to the HSG-Si 15a, the HSG-Si 15a grows and, at the same time, the chlorine radicals given from a $POCl_3$ gas causes an etching action to reduce the HSG-Si 15a, these actions are offset and, as a result, the HSG-Si 15a is not so lost, thus permitting phosphorus to be sufficiently diffused into the HSG-Si 15a.

Figure 7:
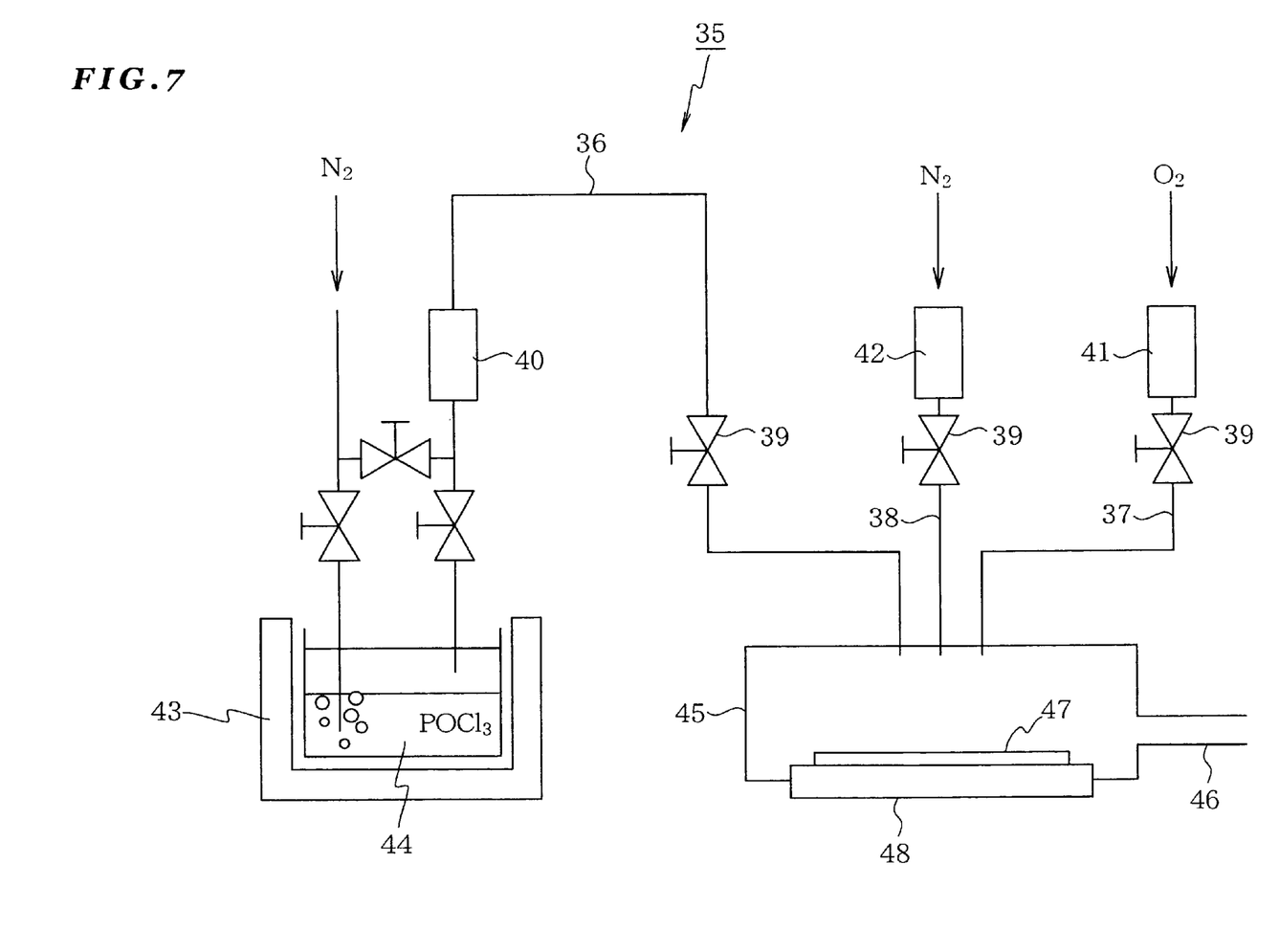
FIG. 7 is outlines a configuration of another example of the phosphorus diffusion apparatus used in the manufacturing method according to the above-mentioned embodiments.

It is not intended to limit the present invention to the above-mentioned embodiments. In fact, many modifications and variation are possible without departing from the spirit of the present invention. For example, the batch-type vertical diffusion furnace used as the phosphorus diffusion apparatus in the above-mentioned embodiments may be replaced with a leaf-type phosphorus processing apparatus shown in FIG. 7. The phosphorus processing apparatus 35 shown in FIG. 7 is provided with three systems of supply pipes 36, 37, and 38 for $POCl_3$, $O_2$, and $N_2$ gases as the supply source of the processing gas, each of these pipes has a valve 39 and mass-flow controllers 40, 41, and 42. The POCl₃ gas is introduced into a processing chamber 45 via the supply pipe 36 after spraying a N₂ gas into POCl₃ 44 contained in a Dewar flask 43. The mixture gas introduced into the processing chamber 45 is diffused inside the chamber and exhausted from the exhaust port 46. Also, the processing chamber 45 is provided at its bottom a heater 48 for holding substrates 47.

Obviously, such specific processing conditions as the types of processing gases, the temperature and time for heat treatment, the film thickness, etc. employed in the above-mentioned embodiments are given only as an example, so that they may be changed as occasion demands. Moreover, the methods for manufacturing semiconductor devices according to the present invention are applicable to the manufacturing of any semiconductor devices having capacitors desired to be increased in capacitance regardless of the capacitor shape or the device type.

As mentioned above, by the methods for manufacturing semiconductor devices according to the present invention, only by controlling the method of diffusing phosphorus, it is possible to suppress the reduction of HSG-Si while doping phosphorus into it, to prevent the deletion of the HSG-Si, thus also preventing the capacitor's capacitance from being decreased. Also, the methods of the present invention need not providing additional steps for preventing the reduction of the HSG-Si, thus avoiding increases in the number of steps required for the overall manufacturing processes as compared to the conventional methods. Further, the methods of the present invention can employ a relatively low heat treatment temperature for phosphorus diffusion, so that even those transistors with a short gate length are not subject to fluctuations in the characteristics, thus qualifying themselves well for use in the manufacturing of logic-mixed memory devices in which are mixed the logic portion having transistors with a short gate length and the DRAM portion.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-321122 (filed on Nov. 11th, 1998) including specification, claims, drawings and summary are incorporated herein by reference in its entirety.

What is claimed is:

1. A method for manufacturing semiconductor devices, comprising the steps of:
   forming a silicon film on a semiconductor substrate;
   conducting heat treatment on said silicon film in an atmosphere of a gas containing silicon, to form hemi-spherical silicon grains to a surface of said silicon film; and
   conducting heat treatment in a phosphorus diffusion apparatus at a prescribed temperature in an atmosphere of a mixture gas containing a gas containing halogen and phosphorus as constituent elements and an oxygen gas, to diffuse phosphorus into said hemi-spherical silicon grains,
   wherein said heat treatment in the phosphorus diffusion apparatus is performed in a range of a mixture ratio in mole of said gas containing halogen and phosphorus against said oxygen gas such that corrosion of silicon is suppressed and also in such a situation that accelerated oxidation of silicon does not occur.

2. The method for manufacturing semiconductor devices according to claim 1, wherein a phosphoryl chloride gas is used as said gas containing halogen and phosphorus as constituent elements.

3. The method for manufacturing semiconductor devices according to claim 2, wherein a mixture ratio in mole of said oxygen gas against said phosphoryl chloride gas is set at 2 or less.

4. The method for manufacturing semiconductor devices according to claim 2, wherein a mixture ratio in mole of said oxygen gas against said phosphoryl chloride gas is set at 0.2 through 1.5.

5. The method for manufacturing semiconductor device according to claim 1, wherein a temperature for heat treatment in said step of diffusing phosphorus is set at 700–780° C.

6. The method for manufacturing semiconductor devices according to claim 1, wherein a step of patterning said silicon film into a prescribed shape is provided between said step of forming said silicon film and said step of forming silicon grains to a surface of said silicon film; and
   diffusing phosphorus into silicon grains for forming a lower electrode of a capacitor.

7. A method for manufacturing semiconductor devices, comprising the steps of:
   forming a silicon film on a semiconductor substrate;
   conducting heat treatment on said silicon film in an atmosphere of a gas containing silicon, to form hemi-spherical silicon grains to a surface of said silicon film;
   adjusting timing respectively of introducing a plurality of types of gases which are used in a prescribed phosphorus diffusion apparatus into a processing chamber, and introducing beforehand a gas for forming a corrosion-preventing film on a surface of said hemi-spherical silicon grains, the film having a function to prevent corrosion of silicon by halogen and to permit phosphorus to permeate; and
   introducing subsequently a gas containing halogen and phosphorus and conducting heat treatment at a prescribed temperature, to diffuse phosphorus into said hemi-spherical silicon grains through said corrosion-preventing film.

8. The method for manufacturing semiconductor devices according to claim 7, wherein an oxygen gas is used as said gas for forming said corrosion-preventing film.

9. The method for manufacturing semiconductor devices according to claim 7, wherein a film thickness of said corrosion-preventing film is set at 2–5 nm.

10. The method for manufacturing semiconductor devices according to claim 8, wherein a film thickness of said corrosion-preventing film is set at 2–5 nm.

11. The method for manufacturing semiconductor devices according to claim 7, wherein a phosphoryl chloride gas is used as said gas containing halogen and phosphorus as constituent elements.

12. The method for manufacturing semiconductor devices according to claim 8, wherein a phosphoryl chloride gas is used as said gas containing halogen and phosphorus as constituent elements.

13. The method for manufacturing semiconductor devices according to claim 9, wherein phosphoryl chloride gas is used as said gas containing halogen and phosphorus as constituent elements.

14. The method for manufacturing semiconductor evices according to claim 10, wherein phosphoryl chloride gas is used as said gas containing halogen and phosphorus as constituent elements.

15. The method for manufacturing semiconductor devices according to claim 7, wherein a step of patterning said silicon film into a prescribed shape is provided between said step of forming said silicon film and said step of forming silicon grains to a surface of said silicon film; and diffusing phosphorus into silicon grains for forming a lower electrode of a capacitor.

16. The method for manufacturing semiconductor devices according to claim 11, wherein phosphoryl chloride gas is used as said gas containing halogen and phosphorus as constituent elements.

17. A method for manufacturing semiconductor devices, comprising the steps of:

forming a silicon film on a semiconductor substrate;

conducting heat treatment on said silicon film in an atmosphere of a gas containing silicon, to form hemi-spherical silicon grains to a surface of said silicon film; and introducing a gas containing silicon into a processing chamber of a phosphorus diffusion apparatus at the same time or prior to introduction of a gas containing halogen and phosphorus into said processing chamber and conducting heat treatment at a prescribed temperature, to supply silicon from said gas containing silicon for diffusing phosphorus into said hemi-spherical silicon grains as preventing reduction of said hemi-spherical silicon grains caused by corrosion of silicon by halogen.

18. The method for manufacturing semiconductor devices according to claim 17, wherein a mono-silane or di-silane gas is used as said gas containing phosphorus.

19. The method for manufacturing semiconductor devices according to claim 16, wherein a mono-silane or di-silane gas is used as said gas containing phosphorus.

20. The method for manufacturing semiconductor devices according to claim 7, wherein a temperature for heat treatment in said step of diffusing phosphorus is set at 700–780° C.

21. The method for manufacturing semiconductor devices according to claim 17, wherein a temperature for heat treatment in said step of diffusing phosphorus is set at 700–780° C.

22. The method for manufacturing semiconductor devices according to claim 17, wherein a step of patterning said silicon film into a prescribed shape is provided between said step of forming said silicon film and said step of forming silicon grains to a surface of said silicon film; and diffusing phosphorus into silicon grains for forming a lower electrode of a capacitor.

23. The method for manufacturing semiconductor devices according to claim 21, which manufactures logic-mixed memory devices having a capacitor.

* * * * *